(12) United States Patent
Harris et al.

(10) Patent No.: US 7,326,971 B2
(45) Date of Patent: Feb. 5, 2008

(54) GALLIUM NITRIDE BASED HIGH-ELECTRON MOBILITY DEVICES

(75) Inventors: Christopher Harris, Taby (SE); Thomas Gehrke, Manassas Park, VA (US); T. Warren Weeks, Jr., Charleston, SC (US); Cem Basceri, Reston, VA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/147,341

(22) Filed: Jun. 8, 2005

(65) Prior Publication Data

US 2006/0278892 A1 Dec. 14, 2006

(51) Int. Cl.
*H01L 29/778* (2006.01)

(52) U.S. Cl. .............................. 257/194; 257/E29.246; 257/E29.252

(58) Field of Classification Search ................ 257/194, 257/192, 20, 195, 196, 201, E29.248, E29.246, 257/E29.252, E29.253, 472; 438/172
See application file for complete search history.

(56) References Cited

U.S. PATENT DOCUMENTS

| | | | | |
|---|---|---|---|---|
| 4,424,525 | A * | 1/1984 | Mimura | 257/194 |
| 5,105,241 | A * | 4/1992 | Ando | 257/194 |
| 5,381,027 | A * | 1/1995 | Usagawa et al. | 257/192 |
| 5,821,170 | A * | 10/1998 | Klingbeil et al. | 438/745 |
| 5,929,467 | A | 7/1999 | Kawai et al. | |
| 6,100,549 | A | 8/2000 | Weitzel et al. | |
| 6,140,169 | A | 10/2000 | Kawai et al. | |
| 6,150,680 | A | 11/2000 | Eastman et al. | |
| 6,504,176 | B2 | 1/2003 | Kitabatake et al. | |
| 6,534,801 | B2 | 3/2003 | Yoshida | |
| 6,544,867 | B1 | 4/2003 | Webb et al. | |
| 6,765,242 | B1 * | 7/2004 | Chang et al. | 257/197 |
| 6,777,315 | B1 | 8/2004 | Van Nostrand | |
| 7,084,441 | B2 * | 8/2006 | Saxler | 257/243 |
| 2001/0015437 | A1 * | 8/2001 | Ishii et al. | 257/12 |
| 2004/0041169 | A1 * | 3/2004 | Ren et al. | 257/192 |
| 2005/0194602 | A1 * | 9/2005 | Moon et al. | 257/94 |
| 2006/0019435 | A1 | 1/2006 | Sheppard et al. | |
| 2006/0054917 | A1 * | 3/2006 | Lee et al. | 257/103 |
| 2006/0054925 | A1 | 3/2006 | Kikkawa | |
| 2006/0073621 | A1 | 4/2006 | Kneissel et al. | |
| 2006/0278892 | A1 | 12/2006 | Harris et al. | |
| 2006/0281238 | A1 | 12/2006 | Harris et al. | |
| 2007/0032046 | A1 | 2/2007 | Dmitriev et al. | |

OTHER PUBLICATIONS

Gaska et al. High Temperature Performance of AlGaN/GaN HFET's on SiC Substrates. IEEE Electron Device Letters, vol. 18, No. 10. (1997).*
C. Theodoropoulos et al.; Design of Gas Inlets for the Growth of Gallium Nitride by Metalorganic Vapor Phase Epitaxy; Journal of Crystal Growth; 2000.
C. Poblenz et al.; Effect of Carbon Doping on Buffer Leakage in AlGaN/GaN High Electron Mobility Transistors; J. Vac. Sci. Technol. B22 May, Jun. 2004.

* cited by examiner

Primary Examiner—Matthew C. Landau

(57) ABSTRACT

A heterojunction device includes a first layer of p-type aluminum gallium nitride; a second layer of undoped gallium nitride on the first layer; a third layer of aluminum gallium nitride on the second layer; and an electron gas between the second and third layers. A heterojunction between the first and second layers injects positive charge into the second layer to compensate and/or neutralize negative charge within the electron gas.

19 Claims, 5 Drawing Sheets

GALLIUM NITRIDE BASED HIGH-ELECTRON MOBILITY DEVICES

BACKGROUND OF THE INVENTION

1. Field of the Invention

The present invention relates to aluminum gallium nitride/gallium nitride (AlGaN/GaN) high-electron mobility devices for use in high-power, high-frequency device applications, and more particularly to the control or compensation of charge within the channel of such high-electron mobility devices.

2. Background

The aluminum gallium nitride/gallium nitride heterointerface or heterojunction creates a planar region of high charge and high mobility electrons called a two-dimensional electron gas (2DEG), and is commonly used in high-electron mobility devices. However, typical performance problems with gallium nitride based high-electron mobility devices include dispersion related to unintentional traps in the nominally undoped or intrinsic gallium nitride buffer layer. These traps result in reduced channel charge in the two dimensional electron gas, current slump during device operation and reduced device lifetimes, among other problems. Also, AlGaN/GaN high-electron mobility devices are planar growth structures that are typically depletion-mode devices that are normally-ON in their unbiased state, so that electrical current flows between source and drain contacts even when voltage is not applied to a corresponding gate contact. For electrical power switching applications, normally-OFF or enhancement-mode devices are preferable, such that charge does not flow between source and drain contacts in absence of applied voltage to the corresponding gate contact. Thus, there is a need to provide high-electron mobility devices having improved performance, and also normally-OFF high-electron mobility devices having improved performance.

SUMMARY

In accordance with an exemplary embodiment, a heterojunction device includes in combination a first layer of p-type $Al_xGa_{(1-x)}N$; a second layer of undoped GaN on the first layer; a third layer of nominally undoped $Al_xGa_{(1-x)}N$ on the second layer; and an electron gas between the second and third layers.

In accordance with a further exemplary embodiment, a double heterojunction device includes in combination a first layer of intrinsic GaN having a first surface and a second surface opposite the first surface; a second layer of nominally undoped $Al_xGa_{(1-x)}N$ on the first surface of the first layer; an electron gas between the first and second layers, comprised of negative charge provided by the second layer; and a third layer of p-type $Al_xGa_{(1-x)}N$ on the second surface of the first layer, that provides positive charge to the first layer to neutralize negative charge within the electron gas.

BRIEF DESCRIPTION OF THE DRAWINGS

The above and other objects and features of the present invention will become apparent from the following description of the preferred embodiments made in conjunction with the accompanying drawings, in which.

DETAILED DESCRIPTION

Figure 1:
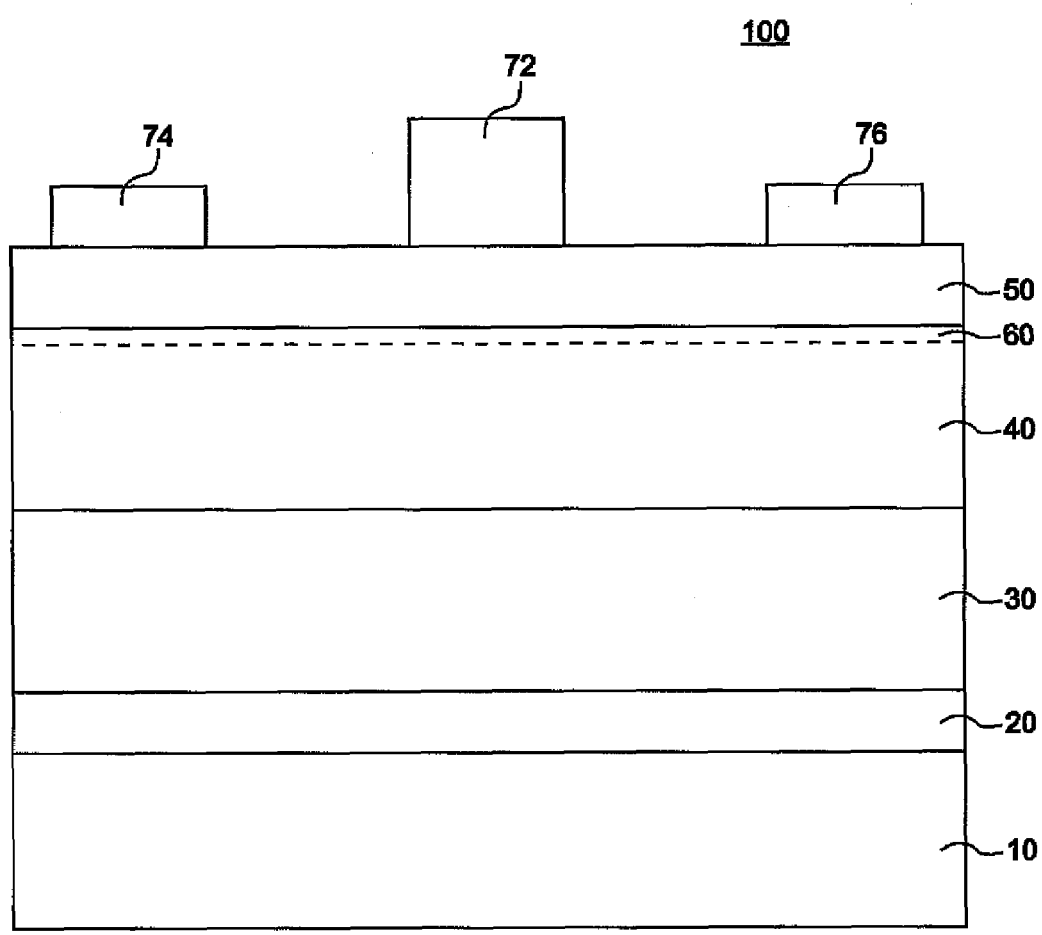
FIG. 1 illustrates a cross-section of a normally-ON depletion-mode high-electron mobility device of a first embodiment.

The present invention will now be described more fully with reference to the accompanying drawings, in which preferred embodiments of the invention are shown. This invention may, however, be embodied in many different forms and should not be construed as limited to the embodiments set forth herein. Rather, the embodiments as described are provided so that this disclosure will be thorough and complete and will fully convey the concept of the invention to those skilled in the art. In the drawings, the shapes of elements are exaggerated for clarity, and are not necessarily drawn to scale, and like reference numerals are used to refer to like elements throughout the application.

FIG. 1 illustrates a normally-ON gallium nitride (GaN) high-electron mobility device 100 of a first embodiment. In this particular embodiment, a high-electron mobility transistor (HEMT) is described. However, it should be readily understood in view of the following description, that the principles of this invention may also be contemplated as applicable for field effect transistors including metal semiconductor field effect transistors (MESFETs), metal insulator field effect transistors (MISFETs) or metal oxide field effect transistors (MOSFETs), and for bipolar junction transistors (BJTs) and light emitting diodes (LEDs), for example. Thus, the following should not be construed as limited to the device structures as described.

As illustrated in FIG. 1, the high-electron mobility device 100 includes a buffer layer 20 formed on substrate 10. Buffer layer 20 may be GaN, AlGaN, or aluminum nitride (AlN) and provides an interface from the non-GaN substrate to a GaN based active structure. Buffer layer 20 reduces defect concentration in the active device layers. Substrate 10 may be a semi-insulating substrate such as silicon carbide (SiC), silicon (Si) or sapphire. Buffer layer 20 may be considered as part of substrate 10, whereby the remaining layers as formed on buffer layer 20 may be considered as device layers of the structure. Typically, buffer layer 20 and substrate 10 may respectively have thickness in the range of about 1-5 um.

A p-type aluminum gallium nitride $(Al_xGa_{(1-x)}N)$ layer 30 is epitaxially grown on buffer layer 20. Thereafter, an intrinsic or nominally undoped gallium nitride (GaN) layer 40 is epitaxially grown on p-type AlGaN layer 30. GaN layer 40 is intrinsic (nominally undoped or unintentionally doped), or slightly n-type. That is, GaN layer 40 is not p-type, but is relatively pure, so that the number of holes or scattering points that would contribute to lower mobility within electron gas 60 may be minimized. In this embodiment, GaN layer 40 may have a thickness of about 0.1-1 um. Another AlGaN layer 50 that is nominally undoped is then epitaxially grown on GaN layer 40. As charge transfers from AlGaN layer 50 to GaN layer 40 because of the difference in bandgap between the materials, electron gas 60 comprised of a planar region of high-charge, high mobility electrons is formed in GaN layer 40 at the interface between AlGaN layer 50 and GaN layer 40.

As may be understood in view of FIG. 1, the structure may be characterized as a double heterojunction device, including a first heterojunction between GaN layer 40 and AlGaN layer 50 having electron gas 60 therebetween, and a second heterojunction between GaN layer 40 and AlGaN layer 30. The amount of charge that transfers across the first heterojunction from AlGaN layer 50 to GaN layer 40 to form electron gas 60 depends on the thickness and dopant concentration of AlGaN layer 50, which initially determines the amount of electrons in electron gas 60. In this embodiment, AlGaN layer 50 has a thickness within a range of about 0.01-0.04 μm. AlGaN layer 50 may however be doped n-type, whereby the n-type dopant can be incorporated uniformly within AlGaN layer 50, or in part of the layer only. The n-type dopant impurity in AlGaN layer 50 may be silicon.

The second heterojunction between AlGaN layer 30 and GaN layer 40 is used to compensate or neutralize electrons within electron gas 60. More particularly, AlGaN layer 30 is provided as a dopant compensation source that injects holes or positive charge into GaN layer 40, to improve the mobility of the device. For example, AlGaN layer 30 may have a thickness within a range of about 0.05-0.5 um, a dopant such as carbon (C) or magnesium (Mg), and a dopant concentration within a range of about $10^{16}$-$10^{18}$ cm$^{-3}$. Although GaN layer 40 is nominally undoped and relatively pure as noted above, residual n-type doping resulting from native defects within the material, or unintentional n-type impurities such as oxygen or silicon atoms, create trap states within GaN layer 40. These trap states disperse or scatter electrons within electron gas 60, resulting in reduced channel charge and current slump during device operation. Small amounts of p-type doping within AlGaN layer 30 are transferred as positive charge to GaN layer 40 so as to neutralize or balance residual n-type doping within GaN layer 40. The positive charge transferred to GaN layer 40 recombines with and depletes the n-type trap states, thus reducing scattering and dispersive behavior, to thus improve mobility of the normally-ON device.

Incidentally, the device of FIG. 1 is completed by formation of source and drain electrodes 74 and 76 on AlGaN layer 50, with gate electrode 72 on AlGaN layer 50 between gate electrode 72. Electrodes 72, 74 and 76 may be formed either separately or simultaneously using standard deposition and photolithographic processing, and would typically be either titanium, aluminum, nickel or gold, or alloys thereof. Plural devices such as shown in FIG. 1 may be formed on the substrate, which may then be diced into individual devices.

In a further aspect of the first embodiment as described with respect to FIG. 1, in addition to depleting unwanted n-type trap states to increase mobility within electron gas 60, the thickness and dopant concentration of AlGaN layer 30 may be tailored to increase resistivity within GaN layer 40. That is, transfer of positive charge or holes from AlGaN layer 30 can neutralize electron gas 60 in part, by recombining with electrons within electron gas 60 to partially deplete electron gas 60. For instance, AlGaN layer 30 may be provided as having a dopant concentration and thickness, to thus partially deplete electron gas 60. As a result, the threshold of the normally-ON device may be adjusted so that device may be turned off responsive to a significantly lower voltage as applied to the corresponding control gate.

In connection with a still further aspect of the first embodiment, it is known that high-electron mobility devices typically require semi-insulating substrates having relatively high resistivity in a range of greater than or about $10^7$ Ω-cm. Higher resistivity substrates in a range greater than or equal to about $10^9$ Ω-cm are preferred. Silicon carbide (SiC) substrates can be made to have moderate resistivity in the range of about $10^5$ to $10^7$Ω-cm. According to this aspect of the first embodiment, substrate 10 can be provided as silicon carbide, and the thickness and dopant profile of AlGaN layer 30 may be tailored to deplete unintended residual negative charge in the silicon carbide moderate semi-insulating substrate 10, to thus increase resistivity of silicon carbide substrate 10 to be above $10^5$Ω-cm. The dopant concentration within AlGaN layer 30 may be graded in a vertical direction to have a higher concentration of p-type impurities near the interface with buffer layer 20 and a lower concentration near the interface with GaN layer 40. This profile may be obtained by grading the p-type impurity profile during growth either by varying dopant flow, growth temperature, growth pressure, V/III gas ratios, or aluminum mole fraction (x) of Al$_x$Ga$_{(1-x)}$N layer 30. For example, AlGaN layer 30 in FIG. 1 may have a dopant concentration of about $10^{16}$cm$^{-3}$ at the interface with GaN layer 40, whereby the dopant concentration gradually increases to about $10^{18}$cm$^{-3}$ at the interface with buffer layer 20. This aspect of depleting unintended residual negative charge is also applicable for use with zinc oxide (ZnO), aluminum nitride (AlN), boron nitride (BN) and diamond substrates.

Figure 2:
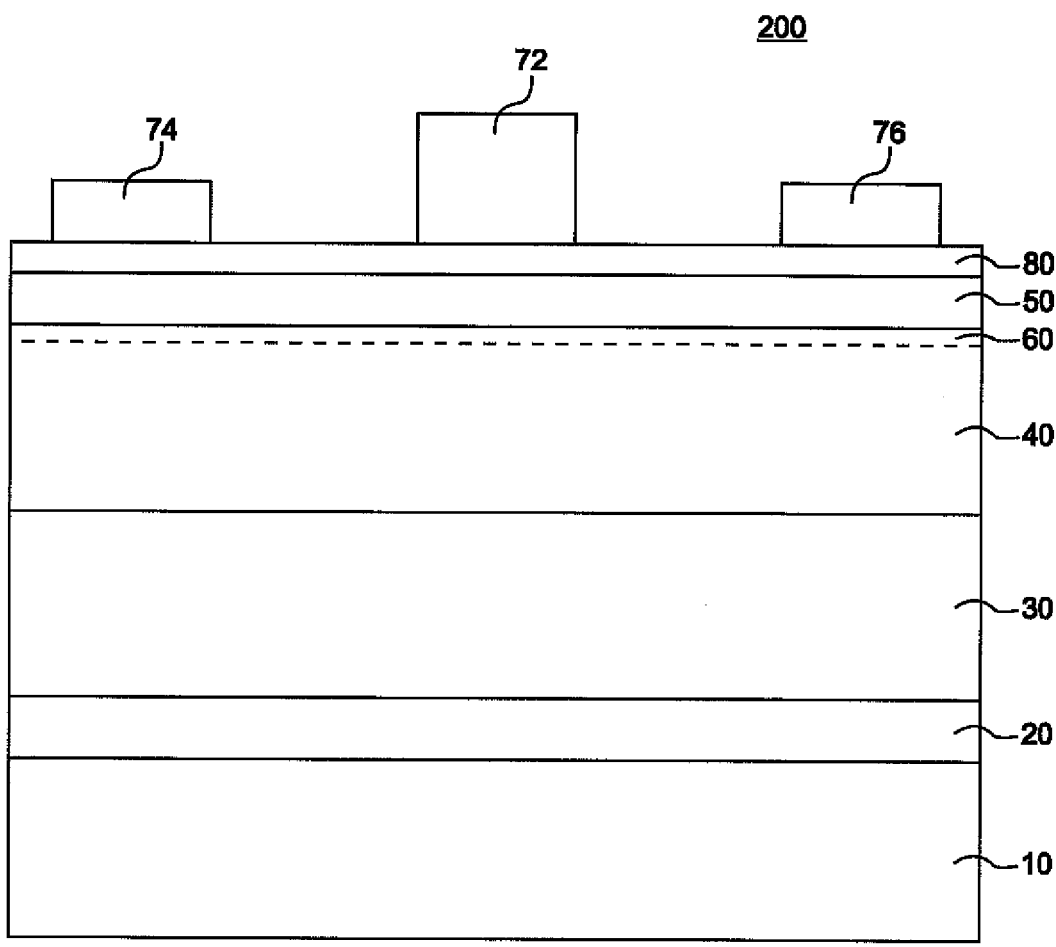
FIG. 2 illustrates a cross-section of a normally-ON depletion-mode high-electron mobility device of a second embodiment including a capping layer.

In a second embodiment as illustrated in FIG. 2, a normally-ON high-electron mobility device 200 is shown which is substantially the same as high-electron mobility device 100 in FIG. 1, and thus includes similar reference numerals. High-electron mobility device 200 of FIG. 2 additionally includes GaN capping layer 80 on AlGaN layer 50. GaN capping layer 80 may have a thickness of about 10-50Å. Gate electrode 72, source electrode 74 and drain electrode 76 are disposed on GaN capping layer 80. GaN capping layer 80 prevents oxidation of AlGaN layer 50. Also, GaN capping layer 80 helps to control charge transfer. For instance, as negative charge transfers from AlGaN layer 50 to GaN layer 40 to form electron gas 60 in GaN layer 40 at the interface therebetween, positive charge consequently develops at the surface of AlGaN layer 50. With the provision of GaN capping layer 80 on AlGaN layer 50, the positive charge that develops at the surface of AlGaN layer 50 is no longer at the upper surface of the device. The use of GaN capping layer 80 thus leads to a more stable device that does not have positive charge accumulated at the upper surface thereof.

Figure 3:
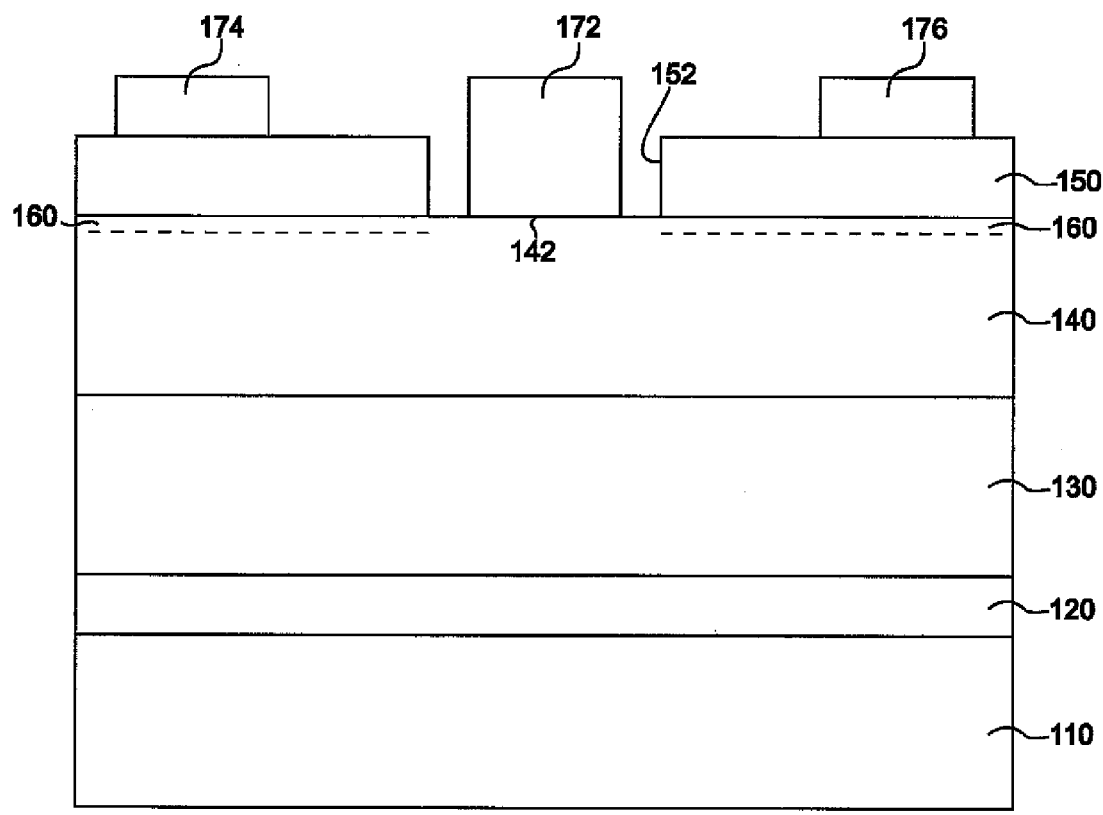
FIG. 3 illustrates a cross-section of a normally-OFF enhancement-mode high-electron mobility device of a third embodiment.

FIG. 3 illustrates a normally-OFF enhancement-mode high-electron mobility device 300 of a third embodiment of the invention. In this embodiment, high-electron mobility device 300 includes substrate 110 and buffer layer 120 that may collectively be considered a device substrate. Device 300 further includes p-type AlGaN layer 130 and nominally undoped GaN layer 140 epitaxially grown on buffer layer 120, as part of device layers of the structure. Substrate 110, buffer layer 120, AlGaN layer 130 and GaN layer 140 of high-electron mobility device 300 in FIG. 3 are substantially the same as substrate 10, buffer layer 20, AlGaN layer 30 and GaN layer 40 of high-electron mobility device 100 in FIG. 1, and detailed description thereof is thus omitted for the sake of brevity.

As illustrated in FIG. 3, AlGaN layer 150 is formed on GaN layer 140 as having an opening 152 formed therethrough to the upper surface of GaN layer 140. AlGaN layer 150 is epitaxially grown on GaN layer 140, and opening 152 is formed within AlGaN layer 150 using standard photolithographic processing. For example, a photoresist layer (not shown) may be formed in a desired pattern on an epitaxially grown AlGaN layer, and the epitaxially grown AlGaN layer is subsequently etched with a chlorine or bromine based etchant for example, using the photoresist layer as a mask to provide AlGaN layer 150. The photoresist layer is subsequently removed. AlGaN layer 150 is thus provided as having opening 152 therethrough, which may have a diameter of typically less than 2 um, for example.

Subsequent formation of opening 152 in AlGaN layer 150, gate electrode 172 is formed on GaN layer 140 at area 142 within opening 152. Respective source and drain electrodes 174 and 176 are formed on AlGaN layer 150, with opening 152 therebetween. Electrodes 172, 174 and 176 are formed using standard deposition and photolithographic techniques, either separately or simultaneously.

Due to the differences in bandgap between AlGaN layer 150 and GaN layer 140, negative charge transfers across the heterojunction from AlGaN layer 150 to GaN layer 140, to form electron gas 160 within GaN layer 140 at the heterojunction, under AlGaN layer 150. However, because AlGaN layer 150 is formed as having opening 152 therethrough, a heterojunction is not formed at the surface of GaN layer 140 at area 142. Accordingly, negative charge is not transferred to area 142 near the surface of GaN layer 140 under opening 152. In other words, since AlGaN layer 150 is not provided as a source of negative charge at opening 152, an electron gas is not formed under opening 152 at area 142 of GaN layer 140. Electron gas 160 is thus discontinuous at area 142.

Thus, an enhancement-mode high-electron mobility device 300 that is normally-OFF in an unbiased state is provided. As noted above, electron gas 160 is depleted of negative charge and is discontinuous at area 142 under opening 152 in an unbiased state. Upon application of a negative potential to gate electrode 172, negative charge is injected from gate electrode 172 into area 142 of GaN layer 140, and the corresponding electrons accumulate at the surface of GaN layer 140 to form a channel in area 142 bridging the discontinuous portions of electron gas 160.

In this embodiment, a second heterojunction between AlGaN layer 130 and GaN layer 140 injects positive charge into GaN layer 140 in a similar manner as described with respect to FIG. 1. The dopant concentration and thickness of AlGaN layer 130 may be tailored to further deplete area 142, to thus provide appropriate charge balance and ensure operation of the device in an enhancement-mode.

As noted above, enhancement mode high-electron mobility device 300 in FIG. 3 includes opening 152 that extends entirely through AlGaN layer 150 to the surface of GaN layer 140, so that electron gas 160 is depleted at area 142. However, an enhancement-mode device may be realized without the necessity of an opening that extends entirely through to GaN layer 140, as will be described with reference to FIG. 4.

Figure 4:
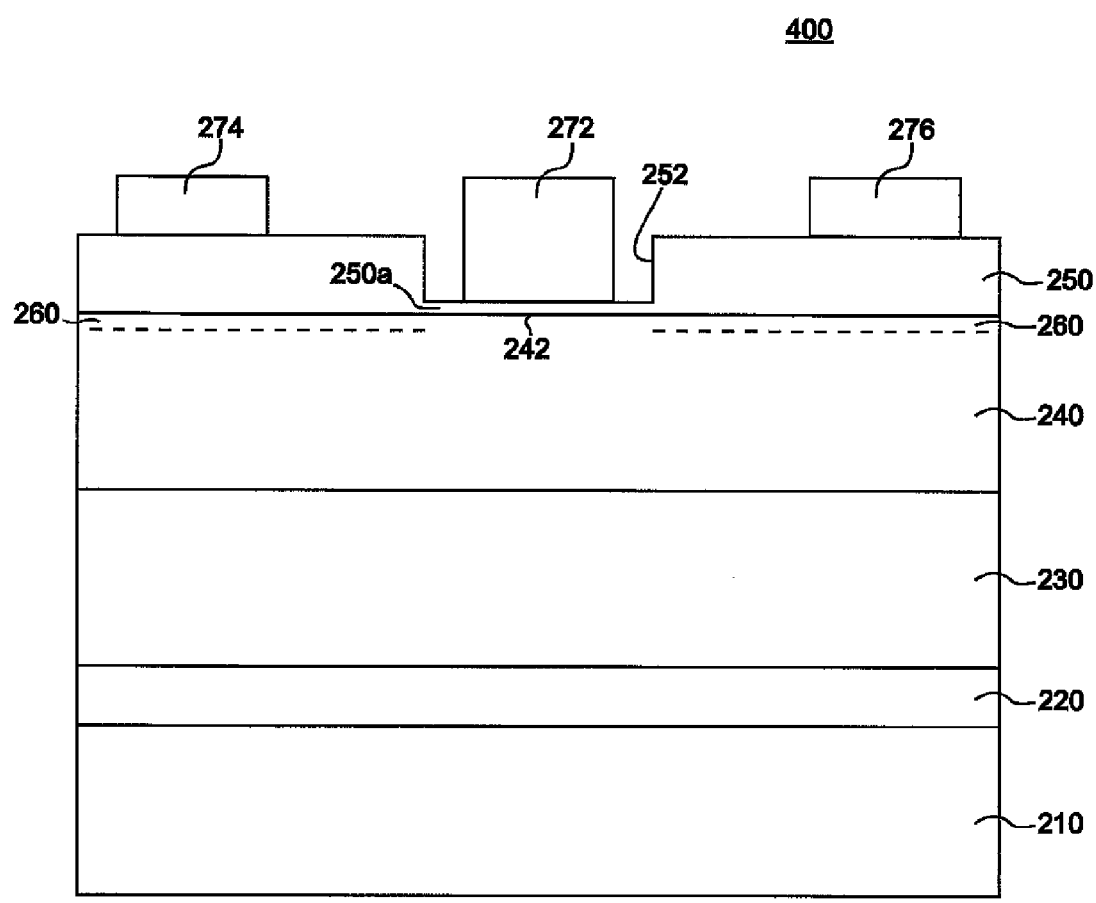
FIG. 4 illustrates a cross-section of a normally-OFF enhancement-mode high-electron mobility device of a fourth embodiment.

FIG. 4 illustrates a normally-OFF enhancement-mode high-electron mobility device 400 that is somewhat similar as high-electron mobility device 300 described with respect to FIG. 3. High-electron mobility device 400 in FIG. 4 includes substrate 210, buffer layer 220, AlGaN layer 230, GaN layer 240, electron gas 260 and electrodes 272, 274 and 276, that are substantially the same as the corresponding layers of device 300 described with respect to FIG. 3. Since these corresponding layers are substantially the same, detailed description thereof will be here omitted for the sake of brevity.

In high-electron mobility device 400 of FIG. 4, opening 252 does not extend completely through AlGaN layer 250 and thus does not expose the surface of GaN layer 240. That is, AlGaN layer 250 includes a thin portion 250a at the bottom of opening 252, and gate electrode 272 is formed on AlGaN layer portion 250a. Opening 252 within AlGaN layer 250 may be formed using standard photolithographic processing in a somewhat similar manner as described with respect to FIG. 3, whereby etching of an epitaxially grown AlGaN layer is merely stopped short of the surface of GaN layer 240, so that AlGaN layer 250 may be provided as having opening 252 with AlGaN layer portion 250a at the bottom thereof. For example, AlGaN layer 250 at areas peripheral of opening 252 may have a thickness of about 0.01-0.04 um, while AlGaN layer portion 250a at the bottom of opening 252 may have a thickness of about 0.001-0.01 um.

Enhancement-mode high-electron mobility device 400 in FIG. 4 operates in a similar manner as device 300 described with respect to FIG. 3. However, AlGaN layer 250 at areas peripheral of opening 252 are relatively thicker than AlGaN layer portion 250a, and thus significantly more electrons or negative charge is transferred from AlGaN layer 250 than from AlGaN layer portion 250a. The thickness of AlGaN layer portion 250a, the dopant concentration of AlGaN layer 250 including AlGaN layer portion 250a, and the thickness and dopant concentration of AlGaN layer 230 that injects holes or positive charge into GaN layer 240 via the second heterojunction between GaN layer 240 and AlGaN layer 230, are all tailored to ensure that area 242 under AlGaN layer portion 250a is fully depleted of negative charge when the device is in an unbiased state without potential applied to gate electrode 272. The various parameters are selected to provide appropriate charge balance and optimum channel performance in enhancement mode device 400.

Figure 5:
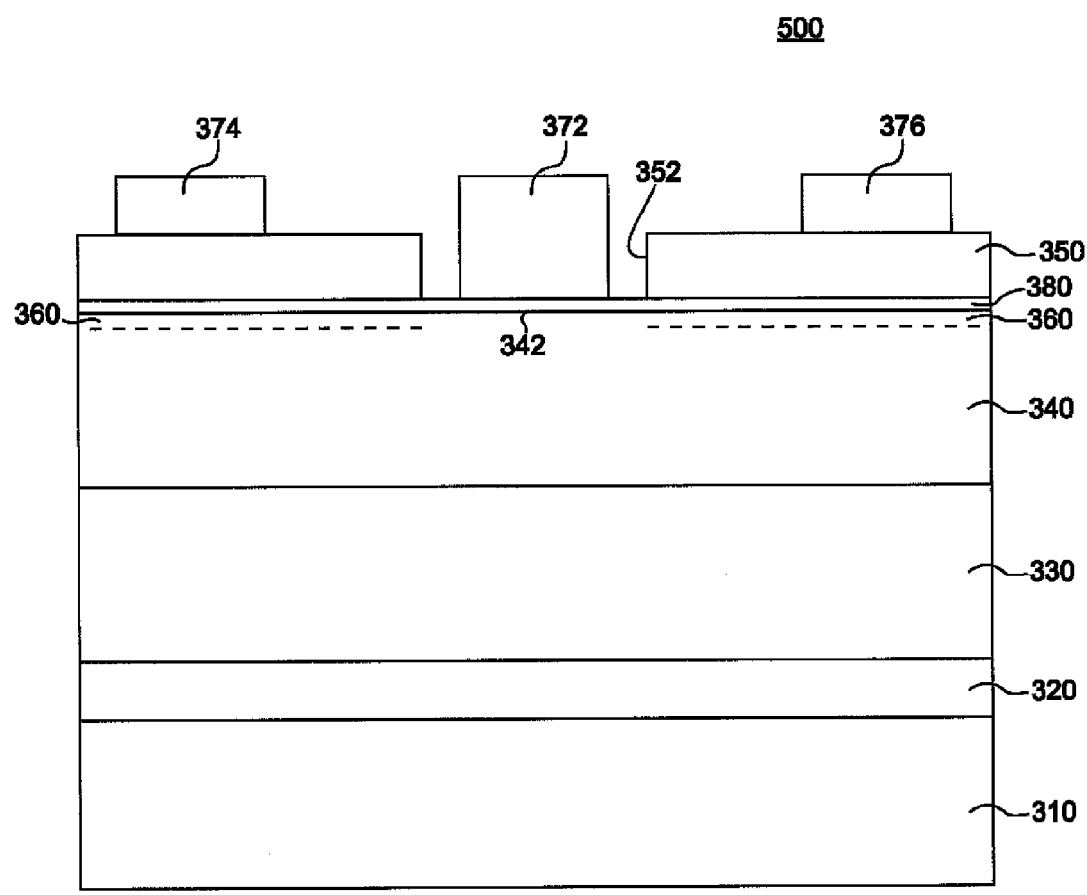
FIG. 5 illustrates a cross-section of a normally-OFF enhancement-mode high-electron mobility device of a fifth embodiment including an etch stop layer.

FIG. 5 illustrates a normally-OFF enhancement-mode high-electron mobility device 500 that is somewhat similar as high-electron mobility device 300 described with respect to FIG. 3. High-electron mobility device 500 in FIG. 5 includes substrate 310, buffer layer 320, AlGaN layer 330, GaN layer 340, electron gas 360, AlGaN layer 350 and electrodes 372, 374 and 376, that are substantially the same as the corresponding layers of device 300 described with respect to FIG. 3. Since these corresponding layers are substantially the same, detailed description thereof will be here omitted for the sake of brevity.

An additional feature of high-electron mobility device 500 in FIG. 5 is etch stop layer 380, which may be an aluminum nitride (AlN) layer. Etch stop layer 380 is epitaxially grown on GaN layer 340, and an AlGaN layer is subsequently epitaxially grown on etch stop layer 380. Thereafter, a photoresist layer (not shown) is formed in a desired pattern on the epitaxially grown AlGaN layer, and the epitaxially grown AlGaN layer is subsequently etched down to etch stop layer 380 to provide AlGaN layer 350 as including opening 352. Accordingly, an opening 352 can be provided through AlGaN layer 350 without exposing the underlying surface of GaN layer 340. Subsequently, gate electrode 372 is formed on etch stop layer 380 within opening 352. Respective source and drain electrodes 374 and 376 are formed on AlGaN layer 350, with opening 352 therebetween. Electrodes 372, 374 and 376 are formed using standard deposition and photolithographic techniques, either separately or simultaneously.

As described, high-electron mobility device 500 of FIG. 5 includes etch stop layer 380 at the bottom of opening 352, and AlGaN layer 350 is removed at opening 352. Since a heterojunction is not formed at the surface of GaN layer 340 at area 342, in an unbiased state negative charge is not transferred into area 342 of GaN layer 340 under opening 352. However, since a heterojunction is provided at the periphery of opening 352 between AlGaN layer 350 and GaN layer 340, negative charge is transferred from AlGaN layer 350 to GaN layer 340, to form discontinuous electron gas 360 in GaN layer 340 at the heterojunction. As described previously, AlGaN layer 350 is nominally undoped, and at the periphery of opening 352 AlGaN layer 350 may have a thickness of about 0.001- 0.01 um for example. Upon application of a negative potential to gate electrode 372, electrons are injected into GaN layer 340, to form a channel in area 342 bridging the discontinuous portions of electron gas 360, to turn on the normally-OFF device.

As noted above, etch stop layer 380 may be an aluminum nitride layer. In a variation of high-electron mobility device 500 of FIG. 5, etch stop layer 380 may be $Al_yGa_{(1-y)}N$, while layer 350 is $Al_xGa_{(1-x)}N$, wherein y is relatively high in value so that y>x. The underlying $Al_yGa_{(1-y)}N$ etch layer would slow down the etch rate as compared to the $Al_xGa_{(1-x)}N$ layer 350, and the use of such an AlGaN etch stop layer would simplify processing steps necessary to manufacture the structure as compared to a device using an etch stop layer of a different material. Also, etch stop layer 380 would help to reduce alloy scattering.

As described previously, the device layers including AlGaN layer 30, GaN layer 40 and AlGaN layer 50 of FIG. 1 are epitaxially grown on buffer layer 20 in a continuous or same process using metal organic vapor deposition (MOCVD), for example. A still further feature relates to the manner in which p-type AlGaN layer 30 is epitaxially grown.

High energy crystals such as GaN are large bandgap materials, and consequently the incorporation of impurities therein is difficult. The incorporation of p-type impurities into GaN is particularly difficult. In order to alleviate this problem and to enhance p-type doping so as to more easily grow p-type AlGaN layer 30, modest amounts of aluminum are introduced into a preliminary GaN layer during epitaxial growth in this embodiment, and carbon (C) is used as a p-type dopant. The aluminum atoms getter carbon atoms, whereby aluminum and carbon atoms resultingly achieve significant atomic bonding. The aluminum helps the amphoteric carbon atoms sit on the substitutional nitrogen sites ($C_N$), resulting in improved p-type behavior. As a preliminary GaN layer is epitaxially grown, carbon and aluminum are added in the MOCVD process. The incorporation of aluminum should be at low levels not to exceed an aluminum mole fraction of about 0.15% (i.e. x <0.0015) for example, so that the impact on or increase of the bandgap of the layer during epitaxial growth is negligible or at least of no consequence for device operation, while the impact in terms of doping is substantial. For example, 0.1% incorporation of aluminum into the preliminary GaN layer has very small or insignificant impact with respect to bandgap change, but has significant impact on doping levels. In a sense, the GaN preliminary layer may be considered as "co-doped" with aluminum in order to increase incorporation of carbon, although in a strict sense aluminum is not a dopant but may more precisely be characterized as an isoelectric center.

Although the embodiments have been described in detail, the scope should not be limited by the corresponding description in the figures. For instance, any of AlGaN layer 30, GaN layer 40 and AlGaN layer 50 of device 200 in FIG. 1, or any of the corresponding layers in any one of FIGS. 2-5 may contain indium (In) or a corresponding element, to change the bandgap of the corresponding layer. For example, by introducing a small amount of indium into GaN layer 40 of FIG. 1, the bandgap of the layer can be reduced, which consequently increases the number of electrons transferred into the layer, to thus increase mobility.

As a further variation, in a similar manner as described with respect to FIG. 1, the thickness and dopant concentration of AlGaN layers 130, 230 and 330 in FIGS. 3-5 may be tailored to increase the resistivity within the respective GaN layers 140, 240 and 340. That is, the amount of positive charge or holes injected from the AlGaN layer into the GaN layer can be increased, to deplete the electron gas to a greater extent. As a result, the threshold of the normally-OFF devices may be adjusted so that the devices require a higher voltage as applied to the control gate to be turned on.

As a still further variation, various p-type dopants such as Mg, Be, Zn, Ca, Fe, Cd, Cr or the like may also be used in the p-type AlGaN layers, although aluminum would not necessarily getter these p-type dopants. Moreover, GaN capping layer 80 as described with respect to device 200 in FIG. 2 may be used as an uppermost capping layer in either of devices 300, 400 and 500 as respectively described with respect to FIGS. 3-5. Also, etch stop layer 380 as described with respect to device 500 in FIG. 5 may be used in either of devices 100 and 200 described with respect to FIGS. 1 and 2, as disposed between the top surface of the corresponding GaN layer and the upper AlGaN layer. Additionally, p-type AlGaN layers 30, 130, 230 and 330 of FIGS. 2-5 may have dopant profiles that are graded in the vertical direction, as described with respect to FIG. 1. These various changes and modifications of the preferred embodiments, and any others that would become apparent to those of ordinary skill, should be considered within the spirit and scope of the invention.

What is claimed is:

1. A heterojunction device comprising:
   a first layer of p-type $Al_xGa_{(1-x)}N$, wherein x>0;
   a second layer of undoped GaN on the first layer;
   a third layer of nominally undoped $Al_yGa_{(1-y)}N$ on the second layer, wherein y>0; and
   an electron gas between the second and third layers, wherein the first layer has a thickness and an initial p-type dopant concentration to provide positive charge to the second layer to neutralize negative charge of the electron gas to deplete the electron gas.

2. The heterojunction device of claim 1, wherein the third layer provides negative charge to the electron gas, has a first area of first thickness, and has a second area of second thickness that is less than the first thickness, wherein the first area provides more negative charge to the electron gas than the second area.

3. The heterojunction device of claim 2, wherein the electron gas is discontinuous.

4. The heterojunction device of claim 2, further comprising a source contact and a drain contact over the first area of the third layer, and a gate contact over the second area of the third layer intermediate the source and drain contacts.

5. The heterojunction device of claim 1, further comprising a GaN capping layer on the third layer.

6. The heterojunction device of claim 1, wherein the first, second and third layers further include indium that respectively changes bandgaps of the first, second and third layers.

7. The heterojunction device of claim 1, wherein the first layer includes carbon as a p-type dopant and aluminum as a getter of carbon.

8. A heterojunction device comprising:
a first layer of p-type $Al_xGa_{(1-x)}N$, wherein x>0;
a second layer of undoped GaN on the first layer;
a third layer of nominally undoped $Al_yGa_{(1-y)}N$ on a top surface of the second layer, wherein y>0; and
an electron gas between the second and third layers,
wherein the third layer provides negative charge to the second layer to form the electron gas and includes an opening there through over the top surface of the second layer, whereby transfer of negative charge to the second layer under the opening is substantially reduced.

9. The heterojunction device of claim 8, further comprising a source electrode and a drain electrode over the third layer, and a gate electrode in the opening of the third layer intermediate the source and drain electrodes.

10. The heterojunction device of claim 8, wherein the electron gas is discontinuous.

11. The heterojunction device of claim 8, further comprising an aluminum nitride layer between the second and third layers.

12. The heterojunction device of claim 8, further comprising a fourth layer of $Al_zGa_{(1-z)}N$ between the second and third layers, wherein z>y.

13. A heterojunction device comprising:
a first layer of p-type $Al_xGa_{(1-x)}N$, wherein x>0:
a second layer of undoped GaN on the first layer;
a third layer of nominally undoped $Al_yGa_{(1-y)}N$ on the second layer. wherein y>0; and
an electron gas between the second and third layers,
wherein the first layer is disposed on a semi-insulating substrate, and the first layer has a p-type concentration profile that is graded in a vertical direction to have a lower concentration near the second layer and a higher concentration near the semi-insulating substrate.

14. The heterojunction device of claim 13, wherein the semi-insulating substrate is silicon carbide.

15. A double heterojunction device comprising:
a first layer of intrinsic GaN having a first surface and a second surface opposite the first surface;
a second layer of nominally undoped $Al_xGa_{(1-x)}N$ on the first surface of the first layer, wherein x>0;
an electron gas between the first and second layers, comprised of negative charge provided by the second layer; and
a third layer of p-type $Al_yGa_{(1-y)}N$ on the second surface of the first layer, that provides positive charge to the first layer to neutralize negative charge of the electron gas to deplete the electron gas, wherein y>0.

16. The double heterojunction device of claim 15, wherein the electron gas is discontinuous.

17. The double heterojunction device of claim 15, wherein the third layer includes carbon as a p-type dopant and aluminum as a getter of carbon.

18. The double heterojunction device of claim 15, wherein the third layer is disposed on a semi-insulating substrate, and the third layer has a p-type concentration profile that is graded in a vertical direction to have a lower concentration near the first layer and a higher concentration near the semi-insulating substrate.

19. The double heterojunction device of claim 15, wherein x>0.0015.

* * * * *